United States Patent
Sugiyama et al.

(10) Patent No.: US 7,037,738 B2
(45) Date of Patent: May 2, 2006

(54) METHOD OF MANUFACTURING A SEMICONDUCTOR LIGHT-EMITTING ELEMENT

(75) Inventors: Hitoshi Sugiyama, Ashigarashimo-gun (JP); Kenichi Ohashi, Kawasaki (JP); Atsuko Yamashita, Yokosuka (JP); Shoichi Washizuka, Yokohama (JP); Yasuhiko Akaike, Kawasaki (JP); Shunji Yoshitake, Kawasaki (JP); Koji Asakawa, Kawasaki (JP); Katsumi Egashira, Kitakyushu (JP); Akira Fujimoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 325 days.

(21) Appl. No.: 10/346,108

(22) Filed: Jan. 17, 2003

(65) Prior Publication Data

US 2003/0178626 A1 Sep. 25, 2003

(30) Foreign Application Priority Data

Jan. 18, 2002 (JP) ....................... 2002-010571

(51) Int. Cl.
*H01L 21/00* (2006.01)

(52) U.S. Cl. .......................... 438/29; 438/69
(58) Field of Classification Search ............ 438/22, 438/29, 69, 493; 257/79, 88
See application file for complete search history.

(56) References Cited

U.S. PATENT DOCUMENTS

| | | | |
|---|---|---|---|
| 6,078,064 A | | 6/2000 | Ming-Jiunn et al. |
| 6,465,808 B1 | * | 10/2002 | Lin ............................. 257/81 |
| 6,505,959 B1 | * | 1/2003 | Masaki et al. .............. 362/339 |
| 6,565,763 B1 | * | 5/2003 | Asakawa et al. ............. 216/56 |

FOREIGN PATENT DOCUMENTS

| | | |
|---|---|---|
| JP | 2000-315816 | 11/2000 |
| JP | 2001-7399 | 1/2001 |
| JP | 2001-151834 | 6/2001 |
| JP | 2001-307665 | 11/2001 |

OTHER PUBLICATIONS

Y. Kanamori, et al., O plus E, vol. 24, No. 1, pp. 53–59, "Nanometer, Antireflection Structures Fabricated by Fast Atom Beam Etching", Jan. 2002.

R. Windisch, et al., IEEE Transactions on Electron Devices, vol. 47, No. 7, pp. 1492–1498, "40% Efficient Thin–Film Surface–Textured Light–Emitting Diodes by Optimization of Natural Lithography", Jul. 2000.

Y. Kanamori, et al., O plus E, vol. 24, No. 1, pp. 53–59, "Nanometer, Antireflection Structures Fabricated by Fast Atom Beam Etching", Jan. 2002.

R. Windisch, et al., IEEE Transactions on Electron Devices, vol. 47, No. 7, pp. 1492–1498, "40% Efficient Thin–Film Surface–Textured Light–Emitting Diodes By Optimization of Natural Lithography", Jul. 2000.

* cited by examiner

*Primary Examiner*—Long Pham
*Assistant Examiner*—(Vikki) Hoa B. Trinh
(74) *Attorney, Agent, or Firm*—Oblon, Spivak, McClelland, Maier & Neustadt, P.C.

(57) ABSTRACT

There is disclosed a semiconductor light-emitting element comprising a substrate having a first surface and a second surface, a semiconductor laminate formed on the first surface of the substrate and containing a light-emitting layer and a current diffusion layer having a light-extracting surface. The light-emitting element is provided with a light-extracting surface which is constituted by a finely recessed/projected surface, 90% of which is constructed such that the height of the projected portion thereof having a cone-like configuration is 100 nm or more, and the width of the base of the projected portion is within the range of 10–500 nm.

12 Claims, 9 Drawing Sheets

METHOD OF MANUFACTURING A SEMICONDUCTOR LIGHT-EMITTING ELEMENT

CROSS-REFERENCE TO RELATED APPLICATIONS

This application is based upon and claims the benefit of priority from the prior Japanese Patent Applications No. 2002-010571, filed Jan. 18, 2002, the entire contents of which are incorporated herein by reference.

BACKGROUND OF THE INVENTION

1. Field of the Invention

The present invention relates to a semiconductor light-emitting element such as a light-emitting diode (LED), a semiconductor laser (LD), etc., and to a method of manufacturing the semiconductor light-emitting element.

2. Description of the Related Art

A light-emitting diode of high luminance is conventionally constructed such that a light-emitting portion constituted by a double-hetero structure, etc., is disposed on the surface of a semiconductor substrate, and a current diffusion layer is deposited on the light-emitting portion. As this light-emitting diode is packaged by resin, the upper portion of the current diffusion layer is covered with a transparent resin layer to protect the light-emitting element.

In the light-emitting diode constructed in this manner, the critical angle between the current diffusion layer (refractive index 3.1–3.5) and the layer of the transparent resin (refractive index about 1.5) is within the range of 25 to 29 degrees. Light having a larger incidence angle than this critical angle is totally reflected, thus greatly degrading the probability of the light being emitted from the light-emitting element. Therefore, the extraction efficiency of the light that can be actually generated from the light-emitting diode is as low as 20% or so at present.

Incidentally, as for the method of roughening the surface of the current diffusion layer, there is known a technique of treating the surface of the current diffusion layer with hydrochloric acid, sulfuric acid, hydrogen peroxide or a mixed solution comprising these chemicals, thereby obtaining a surface-roughened chip (Japanese Patent Unexamined Publication (Kokai) 2000-299494 and Japanese Patent Unexamined Publication (Kokai) H4-354382). These methods are however accompanied by the problem that due to the influence of the crystallinity of the substrate, the roughening of the surface of the current diffusion layer may become impossible depending on the orientation of the surface being exposed. Therefore, roughening of the surface of the chip may not necessarily be possible, so that, the extraction efficiency of the light is prevented from being improved, thus making it difficult to enhance the luminance of the light-emitting diode.

As described above, the conventional light-emitting diode packaged by resin is accompanied by the problem that the incident light to be entered obliquely into the interface between the uppermost layer of the semiconductor multi-layer including a light-emitting layer and a transparent resin is totally reflect from the interface, thus degrading the light extraction efficiency of the light. Further, this problem is not limited to a light-emitting diode, but is also applicable to a surface-emitting type semiconductor laser.

BRIEF SUMMARY OF THE INVENTION

A semiconductor light-emitting element according to one embodiment of the present invention comprises:

a substrate having a first surface and a second surface; and a semiconductor laminate formed on the first surface of the substrate and containing a light-emitting layer and a current diffusion layer;

wherein the light-emitting element is provided with a light-extracting surface which is constituted by a finely recessed/projected surface, 90% of which is constructed such that the height of the projected portion thereof having a cone-like configuration is 100 nm or more, and the width of the base of the projected portion is within the range of 10–500 nm.

A method of manufacturing a semiconductor light-emitting element according to one embodiment of the present invention comprises:

forming a semiconductor laminate on a first surface of a substrate having a first surface and a second surface, the semiconductor laminate containing a light-emitting layer and a current diffusion layer;

determining a light-extracting surface for extracting light from the light-emitting layer;

forming a polymer film comprising a diblock copolymer on the light-extracting surface;

subjecting the polymer film to an annealing treatment, thereby phase-separating the diblock copolymer into two phases;

eliminating one of the phases of the diblock copolymer that has been phase-separated to form a mask material layer having a pattern constituted by the other phase; and transferring the pattern of the mask material layer to the light-extracting surface to form finely recessed/projected portions on the light-extracting surface.

DETAILED DESCRIPTION OF THE INVENTION

Next, the embodiments of the present invention will be explained in detail with reference to drawings.

(First Embodiment)

Figure 1:
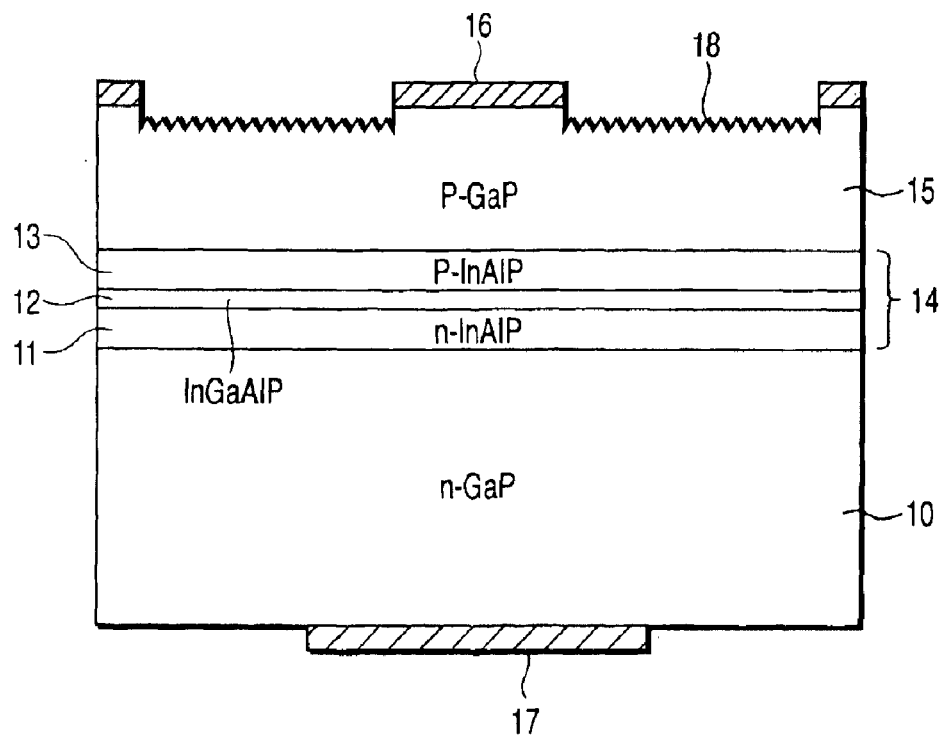
FIG. 1 is a cross-sectional view illustrating the element structure of an LED according to one embodiment of the present invention.

FIG. 1 is a cross-sectional view illustrating the element structure of an LED according to a first embodiment of the present invention.

As shown in FIG. 1, on the top surface (the first surface) of an n-type GaP substrate 10 are deposited semiconductor laminated layers comprising a hetero structure portion 14 which is constituted by an n-type InAlP clad layer 11, an InGaAlP activated layer 12 and a p-type InAlP clad layer 13; and a p-type GaP current diffusion layer 15. A p-side electrode (upper electrode) 16 is formed on part of the surface of the current diffusion layer 15 with the remaining portion of the surface of the current diffusion layer 15 being left exposed. On the other hand, an n-side electrode (lower electrode) 17 is formed on the bottom surface (the second surface) of the substrate 10. The light emitted from the activated layer 12 is taken up from the exposed surface of the current diffusion layer 15. Namely, the exposed surface of the current diffusion layer 15 is employed as a light-extracting surface.

Figure 2A:
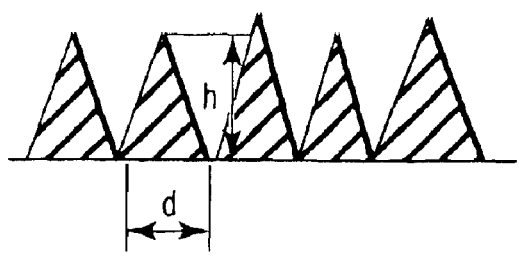
FIGS. 2A to 2D are cross-sectional views each illustrating the state of finely recessed/projected portions according to one embodiment of the present invention.

On this exposed surface of the current diffusion layer 15, there are formed finely recessed/projected portions 18. These finely recessed/projected portions 18 are formed by a diblock copolymer as explained hereinafter, and configured as shown in FIG. 2A, for instance. In FIG. 2A, "h" is the height of the projected portion of the recessed/projected portions 18, while "d" is the length (width) of the base of the projected portion.

This projected portion is triangular in cross section with the width of the base thereof (d) ranging from 10 to 500 nm, the height thereof (h) being 100 nm or more, and the apex angle thereof ranging from 25 to 80 degrees, these numerical limitations being admitted as effective in securing a sufficient effect to improve the light extraction efficiency. The non-uniformity in configuration of the projected portion within the element was found, for example, 100±50 nm in width and 200±100 nm in height (i.e. the distribution of width within the element: ±50%, and the distribution of height within the element: ±50%).

Figure 2B:
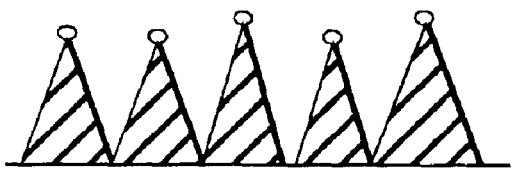
Figure 2C:
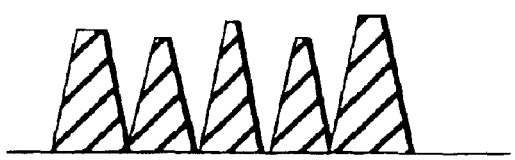
Figure 2D:
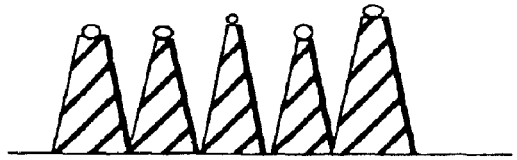

At least part of the recessed/projected portions 18 may be constructed such that the tip end of the projected portion is provided with a fine transparent portion as shown in FIG. 2B. Alternatively, the tip end of the projected portion may be flattened as shown in FIG. 2C. Further, the tip end of the projected portion may be flattened and provided thereon with a fine transparent portion as shown in FIG. 2D.

Next, the process of manufacturing the LED according to this embodiment will be explained with reference to FIGS. 3A to 3D.

Figure 3A:
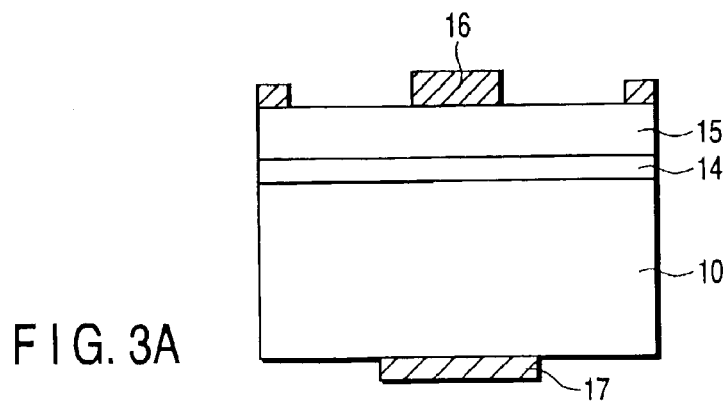
FIGS. 3A to 3D are cross-sectional views each illustrating, stepwise, the manufacturing steps of an LED according to one embodiment of the present invention.

First of all, as shown in FIG. 3A, the hetero structure portion 14 and the current diffusion layer 15 were successively epitaxially grown on the top surface of the n-type GaP substrate 10. Then, the p-side electrode 16 was formed on a desired region of the surface of the current diffusion layer 15, and the n-side electrode 17 was formed on the bottom surface of the substrate 10.

Meanwhile, a 1:2.5 diblock copolymer comprising polystyrene (PS) and poly(methyl methacrylate)(PMMA) was dissolved in a solvent formed of ethylcellosolve acetate (ECA) to prepare a solution of the copolymer. A 1:2–3 diblock copolymer comprising PS and PMMA may be used, and it is possible to use propylene glycol monomethyl ether acetate (PGMEA) or ethyl lactate (EL) as a solvent.

Figure 3B:
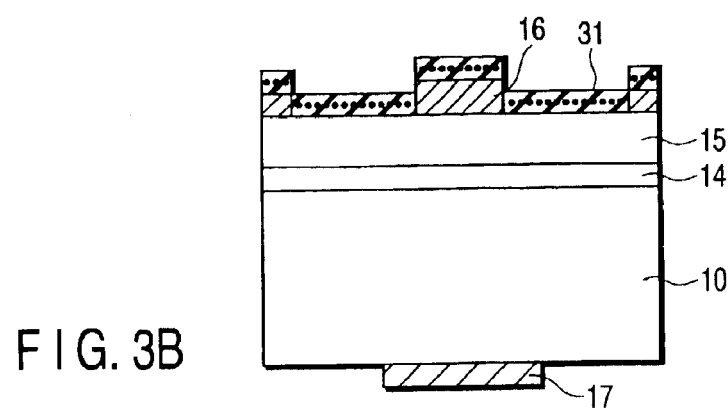

This solution was then spin-coated over the current diffusion layer 15 and the p-side electrode 16 at a rotational speed of 2500 rpm to form a coated film, which was then pre-baked at a temperature of 110° C. for 90 seconds to volatilize the solvent to form a polymer layer 31 as shown in FIG. 3B. Thereafter, the polymer layer 31 was subjected to annealing in a nitrogen gas atmosphere at a temperature of 210° C. for 4 hours to permit the diblock copolymer to take place the phase separation thereof into PS and PMMA.

Figure 3C:
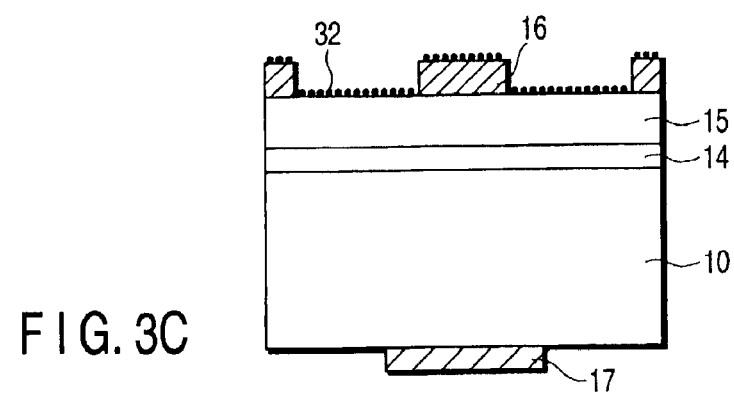
Figure 3D:
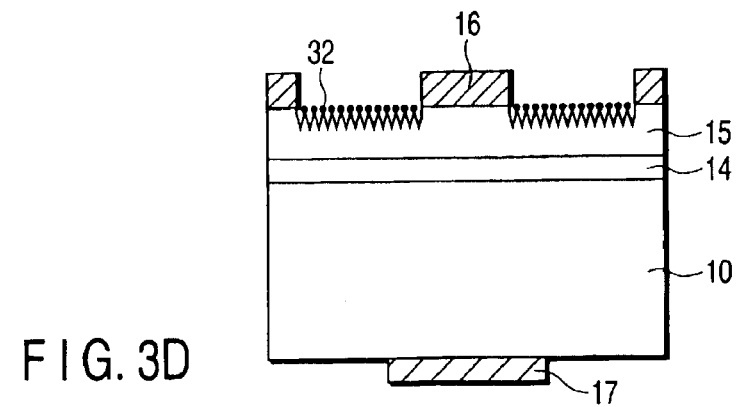

The polymer layer containing this phase-separated diblock copolymer was then subjected to etching by RIE using $CF_4$ (30 sccm) under the conditions of 1.33 Pa in pressure and 100 W in power output. As a result, it was possible to selectively remove the PMMA phase by a difference in etching rate between PS and PMMA, thereby allowing a pattern 32 of PS to remain as shown in FIG. 3C. This PS pattern 32 was subsequently employed as a mask material layer. More specifically, this PS pattern 32 was transcribed onto the surface of the current diffusion layer 15 by RIE using $BCl_3$ (23 sccm) and $N_2$ (7 sccm). This transcription was performed for about 100 seconds under the conditions of: 0.2 Pa in pressure, and 500 W in power output. As a result, it was possible to form a finely recessed/projected pattern on the surface of the current diffusion layer 15 as shown in FIG. 3D. Alternatively, the aforementioned RIE may be performed by using $BCl_3$ (8 sccm), $Cl_2$ (5 sccm) and Ar (37 sccm) with other conditions being the same as described above. Thereafter, the remaining PS pattern was removed by an $O_2$ asher to obtain a structure as shown in FIG. 1.

In this embodiment, it was possible to uniformly form finely recessed/projected portions each projected portion having a cone-like configuration on the exposed surface of the current diffusion layer 15, this exposed surface being functioning as a light-extracting surface. More specifically, the projected portion of the recessed/projected portions was about 100±50 nm in base length, about 200±100 nm in height and 20 to 40 degrees in apex angle. Due to the existence of these finely recessed/projected portions, it is now possible to take up light out of the current diffusion layer 15 even if the incidence angle at the light-extracting surface is increased. Further, even if the light-extracting surface is sealed with a transparent resin, it is possible to improve the light extraction efficiency.

It was confirmed that the improvement of the light extraction efficiency was dependent on the height of the projected portion in the finely recessed/projected portions. More specifically, it was found that when the height of the projected portion in the finely recessed/projected portions was 100 nm (h=100 nm), the light extraction efficiency could be enhanced by a magnitude of about 1.3 times higher as compared with there was no finely recessed/projected portions, and when the height of the projected portion was 200 nm (h=200 nm), the light extraction efficiency could be enhanced by a magnitude of about 1.5 times higher. Namely, it was confirmed that the light extraction efficiency could be significantly enhanced (enhancement by 10% or more) when the height of the projected portion was 100 nm or more. When the height "h" was increased over 200 nm, this enhancement was increased to 1.5 to 1.6 times at most, and any further enhancement could not be obtained. It was also recognized that as long as the width "d" of the base of the projected portion was confined within the range of 10 to 500 nm, it was possible to expect a sufficient enhancement of the light extraction efficiency.

It was also found possible to obtain a sufficient enhancement of the light extraction efficiency as long as at least 90% of the finely recessed/projected portions formed on the surface of the current diffusion layer 15 satisfied the aforementioned conditions. The creation of these finely recessed/projected portions would be possible only when the current diffusion layer 15 was subjected to the aforementioned treatment, using the aforementioned diblock copolymer. Namely, it would be impossible to obtain these finely recessed/projected portions by the conventional roughening work or etching work. It may be possible to form finely recessed/projected portions having almost the same features as described above by using a micro-lithographic technique such as EB, it would lead to a prominent increase in manufacturing cost. Whereas, it is now possible according to this embodiment to form these finely recessed/projected portions more cheaply and easily.

As for the diblock copolymer having a polymer chain which is capable of exhibiting a sufficiently large difference in dry etching rate, it is possible to employ a diblock copolymer having an aromatic ring-containing polymer chain and an acrylic polymer chain. As for the aromatic ring-containing polymer chain, it is possible to employ a polymer chain which can be synthesized through the polymerization of at least one monomer selected from the group consisting of vinyl naphthalene, styrene and derivatives thereof. As for the acrylic polymer chain, it is possible to employ a polymer chain which can be obtained through the polymerization of at least one monomer selected from the group consisting of acrylic acid, methacrylic acid, crotonic acid, and derivatives thereof. A typical example of the diblock copolymer is a 1:2.5 diblock copolymer comprising polystyrene and poly(methyl methacrylate), which was employed in this embodiment.

According to this embodiment, since the finely recessed/projected portions can be uniformly created on the light-extracting surface, it is now possible to prevent the degrading of the light extraction efficiency that may be caused due to the influence by the total reflection of light. As a result, it is now possible to enhance the light extraction efficiency and hence to enhance the luminance of LED. In contrast to the conventional surface-roughening treatment, of substrate using hydrochloric acid, sulfuric acid, hydrogen peroxide or a mixed solution comprising these chemicals, the method of this embodiment enables to form finely recessed/projected portions in a very efficient manner irrespective of the orientation of the crystal plane of substrate.

Moreover, due to the finely recessed/projected portions that have been formed on the light-extracting surface, even the light that has been re-absorbed by the activated layer due to the internal multi-reflection can be taken up out of the light-extracting surface, so that it is now possible to operate an LED at a relatively high temperature (up to 100° C. or more).

(Second Embodiment)

A PS pattern was formed by RIE under the same conditions as described in the aforementioned first embodiment except that $O_2$ was substituted for $CF_4$.

In the same manner as described in the first embodiment, a polymer layer 31 containing a diblock copolymer was formed on the surface of the current diffusion layer 15 and then, the diblock copolymer was subjected to phase separation. Then, the polymer layer 31 was subjected to etching by RIE using $O_2$ gas (30 sccm) under the conditions of 13.3 Pa in pressure and 100 W in power output. In contrast with the etching using $CF_4$, although it was impossible, in this case where $O_2$ was employed, to etch the polymer layer 31 down to the underlying substrate, it was possible to relatively accurately remove the PMMA phase of the PS-PMMA block, thereby forming a PS pattern.

This PS pattern was then transcribed onto the surface of the current diffusion layer 15 by RIE under the same conditions as described in the aforementioned first embodiment except that $Cl_2$ (5 to 40 sccm) was employed as an etching gas. Thereafter, the PS pattern left remained was removed by using an $O_2$ asher.

As a result, in the same manner as in the aforementioned first embodiment, it was possible to form a pattern of recessed/projected portions on the exposed surface of the current diffusion layer 15 constituting a light-extracting surface with the projected portion thereof being about 100±50 nm in base length and about 200±100 nm in height. Accordingly, it was possible to obtain almost the same effects as those obtained in the first embodiment.

(Third Embodiment)

In this embodiment, a PS pattern was formed through the scission of the main chain of polymer by the irradiation of electron beam.

In the same manner as described in the first embodiment, a polymer layer 31 containing a diblock copolymer was formed on the surface of the current diffusion layer 15 and then, the diblock copolymer was subjected to phase separation. Then, an electron beam was irradiated the entire surface of the polymer layer 31 to cut the main chain of PMMA. On this occasion, the conditions of irradiating the electron beam were set to 2 eV. Thereafter, the polymer layer 31 was subjected to development by using a developing solution (for example, a mixed solution comprising MIBK (methylisobutyl ketone) and IPA(isopropanol)). The resultant surface of the polymer layer 31 was then rinsed by IPA or ethanol to selectively dissolve and remove the PMMA, thereby leaving a pattern 32 of PS.

This PS pattern was then transcribed onto the surface of the current diffusion layer 15 by RIE under the same conditions as described in the aforementioned first embodiment except that $Cl_2$ (5 to 40 sccm) was employed as an etching gas. Thereafter, the PS pattern left remained was removed by using an $O_2$ asher.

As a result, in the same manner as in the aforementioned first embodiment, it was possible to form a pattern of recessed/projected portions on the exposed surface of the current diffusion layer 15 constituting a light-extracting surface with the projected portion thereof being about 100±50 nm in base length and about 200±100 nm in height. Accordingly, it was possible to obtain almost the same effects as those obtained in the first embodiment.

(Fourth Embodiment)

In this embodiment, a material containing an aromatic ring-containing polymer chain and an aliphatic double-bond polymer chain was employed as a diblock copolymer.

This aliphatic double-bond polymer is a polymer containing a double-bond in the main chain of the polymer, wherein the double-bond is cut off by the effect of oxidation using ozone for instance. Therefore, it is possible, in the case of a diblock copolymer containing an aromatic ring-containing polymer chain and an aliphatic double-bond polymer chain, to selectively remove the aliphatic double-bond polymer chain. As for specific examples of the aliphatic double-bond polymer chain, it is possible to employ polydiene-based polymer and derivatives thereof. As for specific examples of the diblock copolymer containing an aromatic ring-containing polymer chain and an aliphatic double-bond polymer chain, it is possible to employ a diblock copolymer comprising polystyrene and polybutadiene, a diblock copolymer comprising polystyrene and polyisoprene, etc.

In this embodiment, a 1:2.5 diblock copolymer comprising polystyrene (PS)-polyisoprene was employed to form a polymer layer on the current diffusion layer 15 in the same manner as described in the first embodiment, and then, the diblock copolymer was subjected to phase separation. Subsequently, this phase-separated diblock copolymer was left to stand in an ozone atmosphere for 5 minutes, thereby removing the polyisoprene, thus forming a pattern of PS. Thereafter, by the same procedures as described in the aforementioned first embodiment, the pattern of PS was transcribed onto the surface of the current diffusion layer 15.

As a result, it was possible to form a pattern of recessed/projected portions on the exposed surface of the current diffusion layer 15 constituting a light-extracting surface with the projected portion thereof being about 100±50 nm in base length and about 200±100 nm in height. Accordingly, it was possible to obtain almost the same effects as those obtained in the first embodiment. Even when a copolymer comprising polystyrene and polybutadiene was employed as a diblock copolymer, it was possible, through the same process as described above, to form recessed/projected portions having almost the same features as described above.

(Fifth Embodiment)

FIGS. 4A to 4D are cross-sectional views each illustrating, stepwise, the manufacturing steps of an LED according to a fifth embodiment of the present invention. Incidentally, the same portions as those of FIGS. 3A to 3D will be identified by the same reference numbers in FIGS. 4A to 4D, thereby omitting the detailed explanation thereof.

In this embodiment, the finely recessed/projected portions were formed on the surface of a transparent layer formed on the current diffusion layer.

First of all, after a laminate having the same structure as that of FIG. 3A was formed, a transparent film 41 was formed on the surface of the current diffusion layer 15. This transparent film 41 can be formed, for example, by a sputtering method, a CVD method or a coating method by $SiO_2$, $SiN_2$, $TiO_2$, etc.

Then, by using a solution of the same copolymer and by the same procedures as employed in the aforementioned first embodiment, a polymer film 31 was formed on the transparent film 41. Thereafter, the polymer film 31 was subjected to annealing in a nitrogen atmosphere at a temperature of 210° C. for 4 hours to permit the diblock copolymer to take place the phase separation thereof.

Figure 4A:
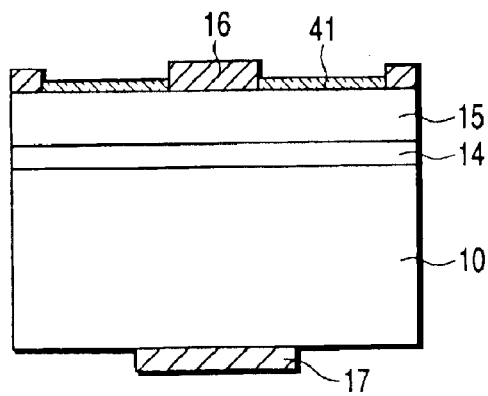
FIGS. 4A to 4D are cross-sectional views each illustrating, stepwise, the manufacturing steps of an LED according to another embodiment of the present invention.
Figure 4B:
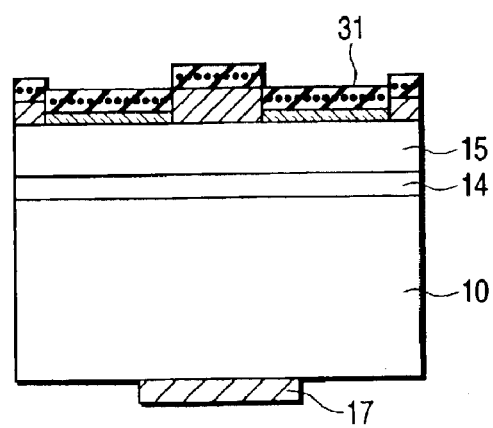
Figure 4C:
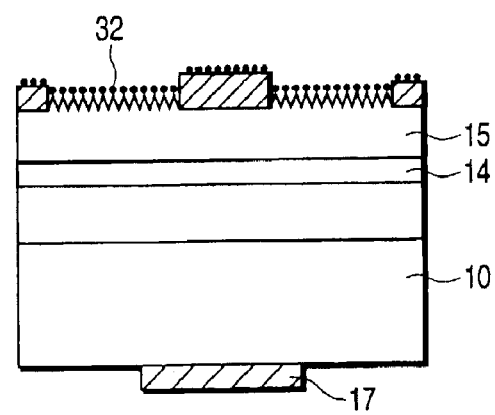

The polymer layer containing this phase-separated diblock copolymer was then subjected to etching by RIE to form a pattern 32 of PS, which was subsequently transcribed onto the surface of the transparent film 41 as shown in FIG. 4C. The RIE in this case can be performed using an etching gas such as $CF_4$, $CHF_3$, $C_4F_8$, $SF_6$, etc. and under the conditions of: 5–10 Pa in pressure, and 100–1000 W in power output.

Figure 4D:
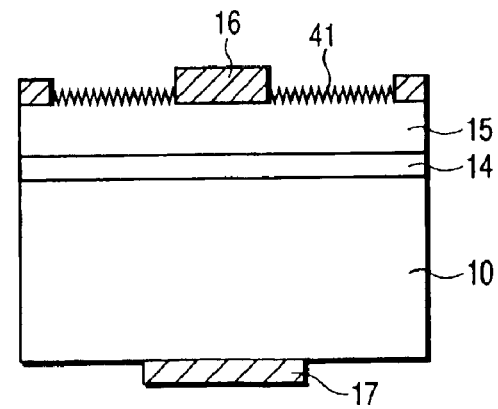

Thereafter, the PS pattern remaining was removed by using an $O_2$ asher to form finely recessed/projected portions on the surface of the transparent film 41 as shown in FIG. 4D. These finely recessed/projected portions were found excellent in uniformity as those of the first embodiment with the projected portion thereof being about 100±50 nm in base length, about 200±100 nm in height.

Alternatively, the finely recessed/projected portions formed in the transparent film 41 may be transcribed onto the current diffusion layer 15 subsequent to the formation of the structure shown in FIG. 4D, and then, the transparent film 41 may be removed by a chemical solution such as HF, $NH_4F$, etc. In this case, the finely recessed/projected portions can be formed on the surface of the current diffusion layer 15 in the same manner as described in the first embodiment.

As explained above, according to this embodiment, since finely recessed/projected portions can be uniformly formed on the surface of the transparent film 41 or the current diffusion layer 15, both functioning as a light-extracting surface, it is possible to prevent the degrading of light extraction efficiency that may be otherwise caused to occur due to the influence of the total reflection of light. Accordingly, it was possible to obtain almost the same effects as those obtained in the first embodiment.

(Sixth Embodiment)

Figure 5A:
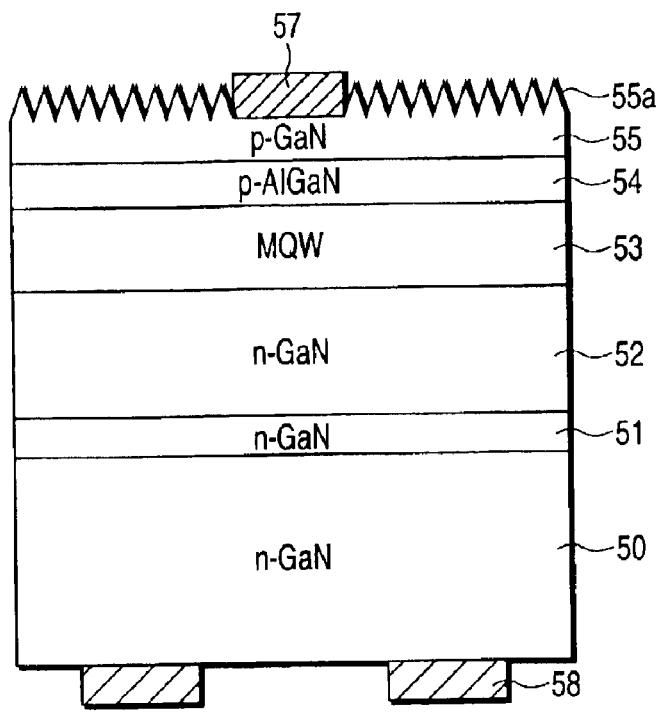
FIGS. 5A and 5B are cross-sectional views each illustrating the element structure of an LED according to a further embodiment of the present invention.
Figure 5B:
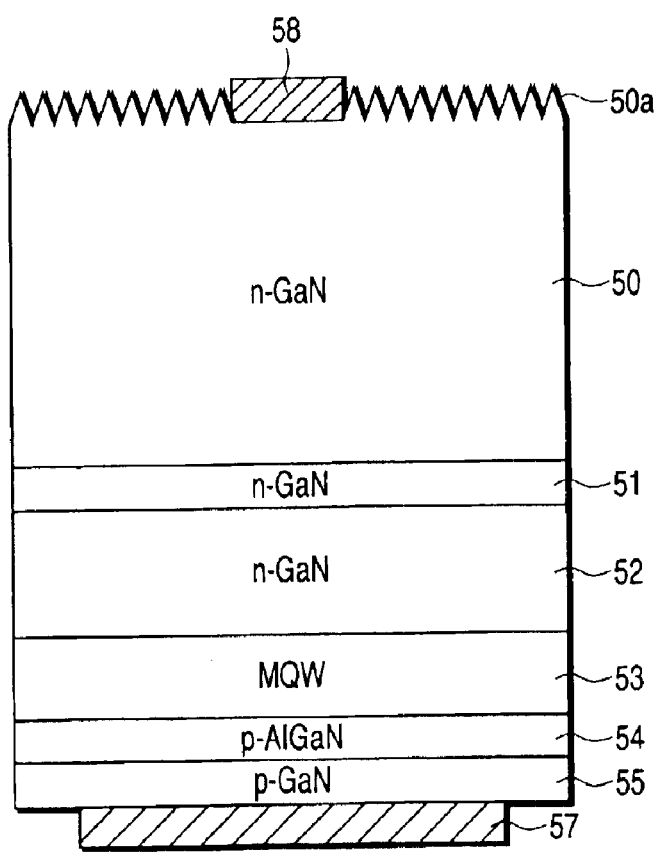

FIGS. 5A and 5B are cross-sectional views each illustrating the element structure of an LED according to a sixth embodiment of the present invention.

The LED shown in FIG. 5A is a Junction Up type LED where the light is extracted from a surface located opposite to the substrate 50. In this case, an n-type GaN buffering layer 51, an n-type GaN clad layer 52, an MQW activated layer 53 containing InGaN/GaN, a p-type AlGaN cap layer 54, and a p-type GaN contact layer 55 are successively deposited on the surface of an n-type GaN substrate 50. A p-side electrode 57 is formed on part of the surface of the contact layer 55 with the remaining portion of the surface of the contact layer 55 being left exposed. On the other hand, an n-side electrode 58 is formed on the bottom surface of the substrate 50. Finely recessed/projected portions 55a are formed on the exposed surface of the contact layer 55 by the same procedures as explained above. Alternatively, the finely recessed/projected portions may be formed in the dielectric film which is disposed on the exposed surface of the contact layer 55.

Since these finely recessed/projected portions 55a can be uniformly formed on the surface of the light-extracting surface, it is possible to enhance the light extraction efficiency.

The LED shown in FIG. 5B is a Junction Down type LED where the light is extracted from the substrate 50 side. In this case also, the same kinds of layers as those of FIG. 5A, i.e. the layers 51, 52, 53, 54 and 55 are successively deposited on the surface of an n-type GaP substrate 50. A p-side electrode 57 is formed on the surface of the contact layer 55, and an n-side electrode 58 which has been patterned is formed partially on the bottom surface of the substrate 50. The remaining region of the bottom surface of the substrate 50 is left exposed and provided with finely recessed/projected portions 50a which have been formed by the same procedures as explained above.

Since these finely recessed/projected portions 50a can be uniformly formed on the bottom surface of the substrate 50 functioning as a light-extracting surface, it is possible to enhance the light extraction efficiency.

In the case of the LED shown in FIG. 5B, the light emitted from the MQW activated layer 53 is reflected by each of the end faces, thus enabling the light to be extracted from the finely recessed/projected portions 50a which are formed on the top surface of the substrate, thereby making it possible to minimize the density of light at the sidewall of chip. As a result, it is possible to prevent the degrading of the resin located on the sidewall of chip and hence to prevent the discoloration of the resin even if the LED is actuated for a long period of time.

(Seventh Embodiment)

Figure 6A:
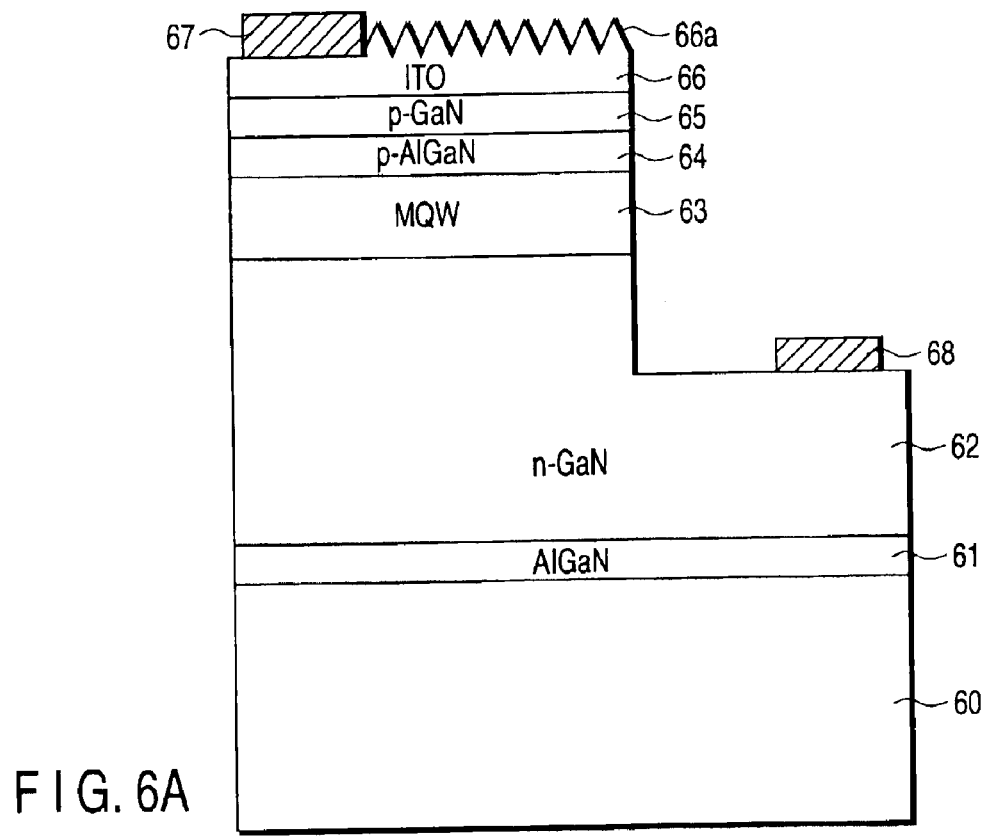
FIGS. 6A and 6B are cross-sectional views each illustrating the element structure of an LED according to a further embodiment of the present invention.
Figure 6B:
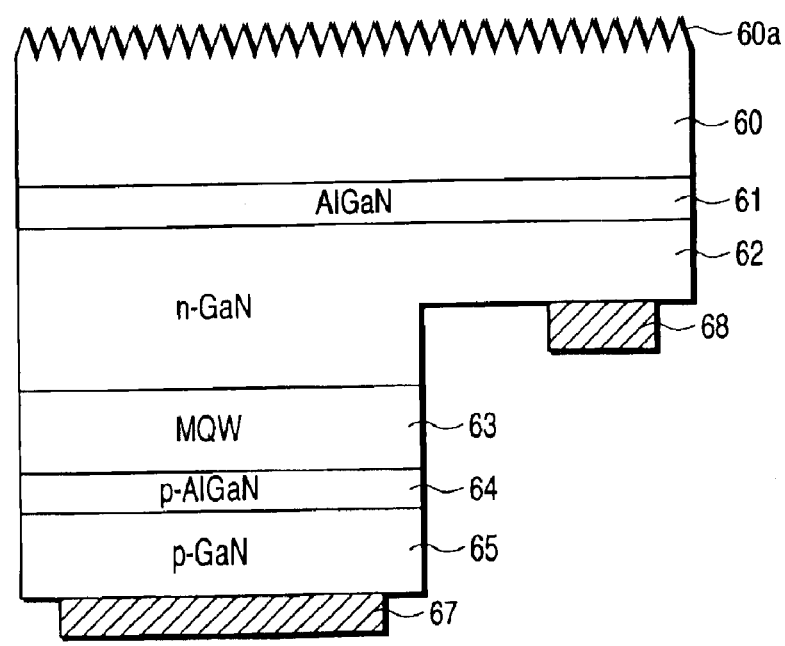

FIGS. 6A and 6B are cross-sectional views each illustrating the element structure of an LED according to a seventh embodiment of the present invention.

The LED shown in FIG. 6A is a Junction Up type LED where the light is extracted from a surface located opposite to the substrate 60. In this case, an AlGaN buffering layer 61, an n-type GaN contact layer 62, an MQW activated layer 63 containing InGaN/GaN, a p-type AlGaN cap layer 64, a p-type GaN contact layer 65 and a transparent electrode 66 made of ITO for instance are successively deposited on the top surface of a sapphire substrate 60. This laminate is partially etched in such a manner that the etched region is extended from the transparent electrode 66 down to an intermediate portion of the n-type GaN contact layer 62.

A p-side electrode 67 is formed on part of the surface of the transparent electrode 66 with the remaining portion of the surface of the transparent electrode 66 being left exposed. On the exposed surface of the contact layer 62, there is formed an n-side electrode 68. Finely recessed/projected portions 66a are formed on the exposed surface of the transparent electrode 66 by using the same procedures as explained above.

Since these finely recessed/projected portions 66a can be uniformly formed on the surface of the transparent electrode 66 constituting a light-extracting surface, it is possible to enhance the light extraction efficiency.

The LED shown in FIG. 6B is a Junction Down type LED where the light is extracted from the substrate 60 side. In this case also, the same kinds of layers as those of FIG. 6A, i.e. the layers 61, 62, 63, 64 and 65 are successively deposited on the surface of a sapphire substrate 60. This laminate is partially etched in such a manner that the etched region is extended from the p-type contact layer 65 up to an intermediate portion of the n-type contact layer 62. A p-side electrode 67 is formed on the surface of the p-type contact layer 65, and an n-side electrode 68 is formed on the exposed surface of the n-type contact layer 62. Finely recessed/projected portions 60a are formed the entire surface of the substrate 60 by using the same procedures as explained above.

Since these finely recessed/projected portions 60a can be uniformly formed on the bottom surface of the substrate 60 functioning as a light-extracting surface, it is possible to enhance the light extraction efficiency.

(Eighth Embodiment)

Figure 7:
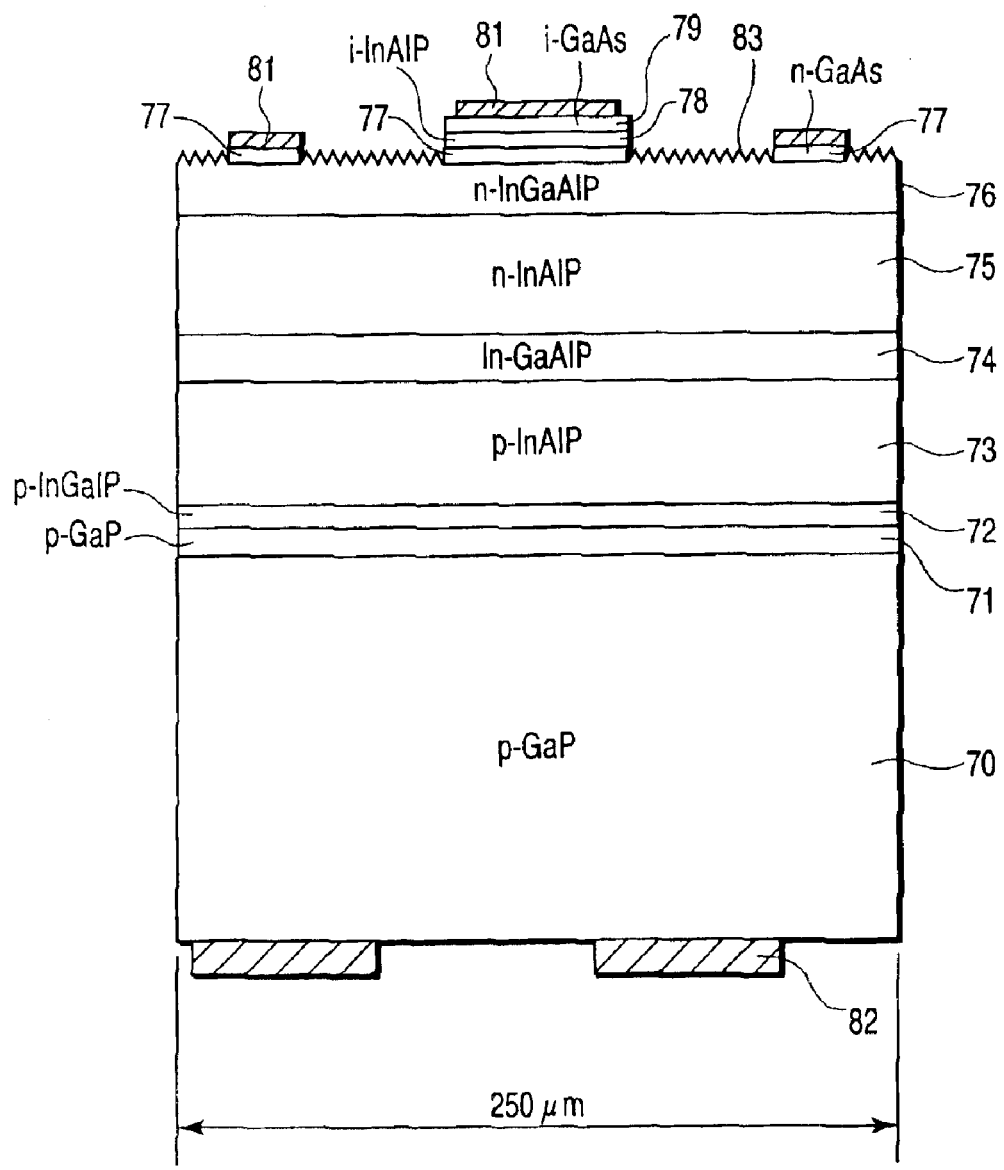
FIG. 7 is a cross-sectional view illustrating the element structure of an LED according to a further embodiment of the present invention.

FIG. 7 is a cross-sectional view illustrating the element structure of an LED according to an eighth embodiment of the present invention.

In this LED shown in FIG. 7, a p-type GaP buffering layer 71, a p-type InGaP adhesion layer 72, a p-type InAlP clad layer 73, an InGaAlP activated layer 74, an n-type InAlP clad layer 75 and an n-type InGaAlP current diffusion layer 76 are successively deposited on the surface of a p-type GaP substrate 70.

At the central region of the surface of the current diffusion layer 76 is formed a laminate containing an n-type GaAs contact layer 77, an i-type InAlP block layer 78, an i-type GaAs block cover layer 79 and an n-side electrode 81. On the peripheral region of the surface of the current diffusion layer 76, there are deposited the n-type GaAs contact layer 77 and the n-side electrode 81. On the other hand, a p-side electrode 82 which has been patterned is formed on the bottom surface of the substrate 70. Finely recessed/projected portions 83 are formed on the exposed surface of the current diffusion layer 75 by the same procedures as explained above.

Next, the process of manufacturing the LED according to this embodiment will be explained with reference to FIGS. 8A to 8C.

Figure 8A:
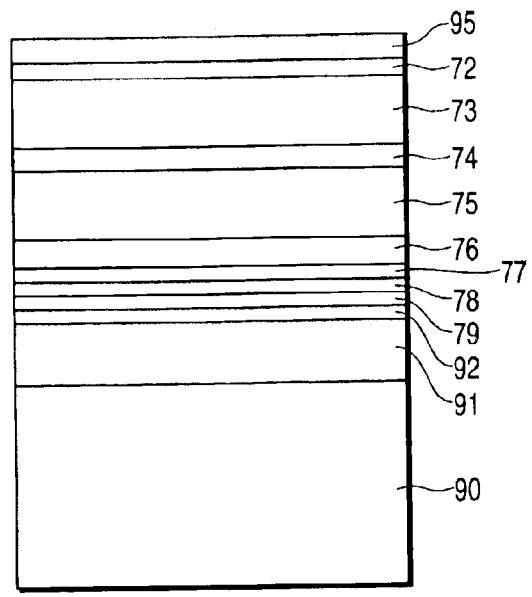
FIGS. 8A to 8C are cross-sectional views each illustrating, stepwise, the manufacturing steps of an LED according to a further embodiment of the present invention.

First of all, as shown in FIG. 8A, an n-type GaAs buffering layer 91 (0.5 μm in thickness; $4 \times 10^{17}$ cm$^{-3}$ in carrier concentration), an i-type InGaP etch-stop layer 92 (0.2 μm), an i-type GaAs block cover layer 79 (0.1 μm), an i-type InAlP block layer 78 (0.2 μm), an n-type GaAs contact layer 77 (0.1 μm in thickness; $1 \times 10^{18}$ cm$^{-3}$ in carrier concentration), an n-type InGaAlP current diffusion layer 76 (1.5 μm in thickness; $4 \times 10^{17}$ cm$^{-3}$ in carrier concentration), an n-type InAlP clad layer 75 (0.6 μm in thickness; $4 \times 10^{17}$ cm$^{-3}$ in carrier concentration), an InGaAlP-MQW activated layer 74 (0.72 μm in thickness; 621 nm in wavelength), a p-type InAlP clad layer 73 (1 μm in thickness; $4 \times 10^{17}$ cm$^{-3}$ in carrier concentration), a p-type InGaP adhesion layer 72 (0.05 μm in thickness; $3 \times 10^{18}$ cm$^{-3}$ in carrier concentration), and an n-type InAlP cap layer 95 (0.15 μm in thickness; $2 \times 10^{15}$ cm$^{-3}$ in carrier concentration) were successively formed on the top surface of the n-type GaAs substrate 90.

Then, the cap layer 95 was removed to expose the adhesion layer 72. On the other hand, a p-type GaP layer 71 (0.2 μm in thickness; $3 \times 10^{18}$ cm$^{-3}$ in carrier concentration) was allowed to grow on the surface of a p-type GaP substrate 70 having a thickness of 150 μm to prepare a supporting substrate. Then, this supporting substrate was adhered onto the adhesion layer 72. Thereafter, the GaAs substrate 90, the buffering layer 91 and the etch-stop layer 92 were etched away to obtain a structure as shown in FIG. 8B.

Figures 8B, 8C:
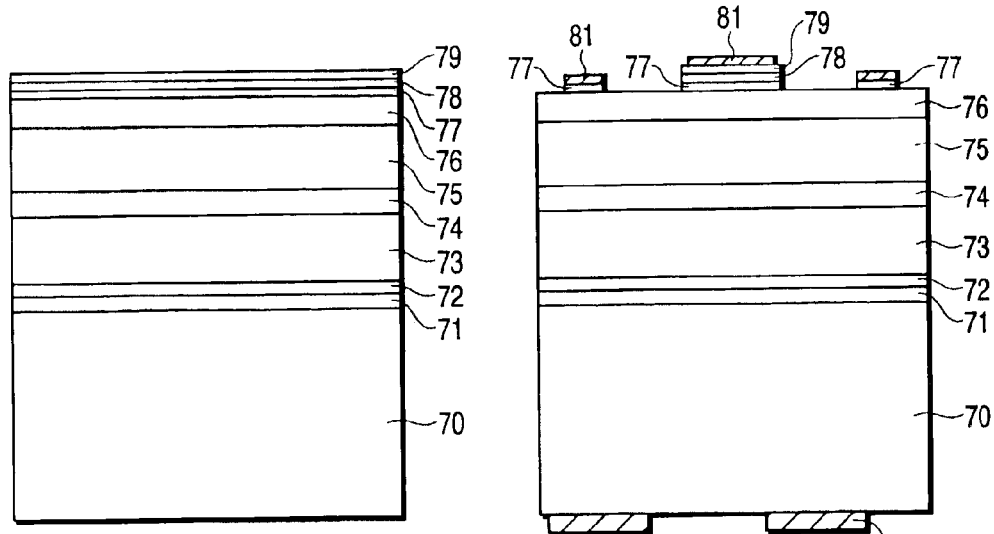

Then, as shown in FIG. 8C, the block cover layer 79, the block layer 78 and the contact layer 77 were etched so as to form a pattern of electrode. On this occasion, the central portion of these layers was patterned into a circular configuration, and the peripheral portion thereof was formed into a pattern of fine linear configuration, and at the same time, the block cover layer 79 and the block layer 78 were removed. In either of patterns, an n-side electrode 81 was formed on the uppermost layer thereof, while a p-side electrode 82 was formed on the bottom surface of the substrate 70. Although not clearly shown in the drawings, the p-side electrode 82 was formed as a circular pattern at four locations of the substrate excluding the central region of the substrate in order to enhance the light extraction efficiency of the region immediately below the portion where the n-side electrode 81 was not located. This p-side electrode 82 can be formed all over the bottom surface of the substrate 70.

Thereafter, finely recessed/projected portions were formed on the surface of the current diffusion layer 76 by using a diblock copolymer and by using the same procedures as explained above, thereby obtaining a structure as shown in FIG. 7.

Since these finely recessed/projected portions 83 can be uniformly formed the entire surface of the current diffusion layer 76 functioning as a light-extracting surface except the region where the electrode 81 was formed, it is possible to enhance the light extraction efficiency.

(Ninth Embodiment)

A method of working an underlying film by using an oxide film (such as SiO$_2$) or a nitride film (such as SiN) as a mask will be explained with reference to FIGS. 9A to 9C.

Figure 9A:
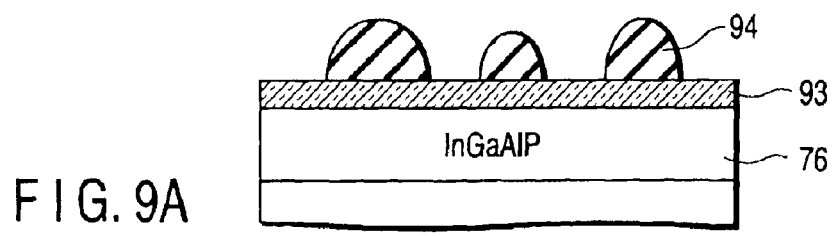
FIGS. 9A to 9C are cross-sectional views each illustrating, stepwise, the manufacturing steps of an LED according to a further embodiment of the present invention.

First of all, as shown in FIG. 9A, an SOG film 93 having a thickness of 0.1 μm and comprising an SiO$_2$ film was formed on the surface of the InGaAlP current diffusion layer 76 of the laminate structure shown in FIG. 7 by a spin-coating method. Then, a polymer film containing a diblock copolymer was formed on the surface of the SOG film 93 in the same manner as described in the first embodiment, and the polymer layer was allowed to take place the phase separation thereof. Thereafter, this phase-separated polymer film was subjected to etching for 30 seconds by RIE using $O_2$ gas (30 sccm) under the conditions of 13 Pa in pressure and 100 W in power output, thereby forming a polymer pattern 94.

Figure 9B:
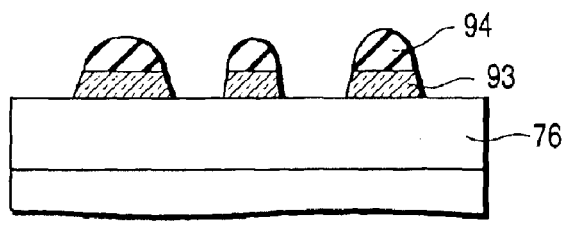
Figure 9C:
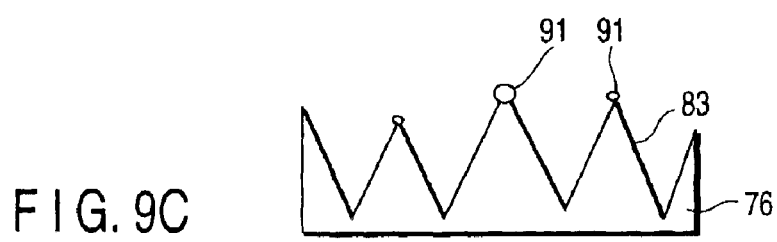

This polymer pattern 94 was then employed as a mask to etch the SOG film 93 for about 100 seconds by RIE using $CF_4$ gas (30 sccm) under the conditions of 1.3 Pa in pressure and 100 W in power output, thereby forming a pattern of SOG as shown in FIG. 9B.

Then, the resultant surface was subjected to etching for about 100 seconds by RIE using $BCl_3$ (8 sccm), $Cl_2$ (5 sccm) and Ar (37 sccm) under the conditions of: 0.2 Pa in pressure, and 500 W in power output. As a result, it was possible, as shown in FIG. 9C, to form finely recessed/projected portions 83 with the projected portion having a minute cone-like configuration 50–300 nm in width and 100–500 nm in height on the surface of the InGaAlP current diffusion layer 76. In this case, the SOG (oxide film) 93 may be left at the apex portion of the finely recessed/projected portions, i.e. no trouble would be raised even if the SOG is left in this manner.

Figure 10:
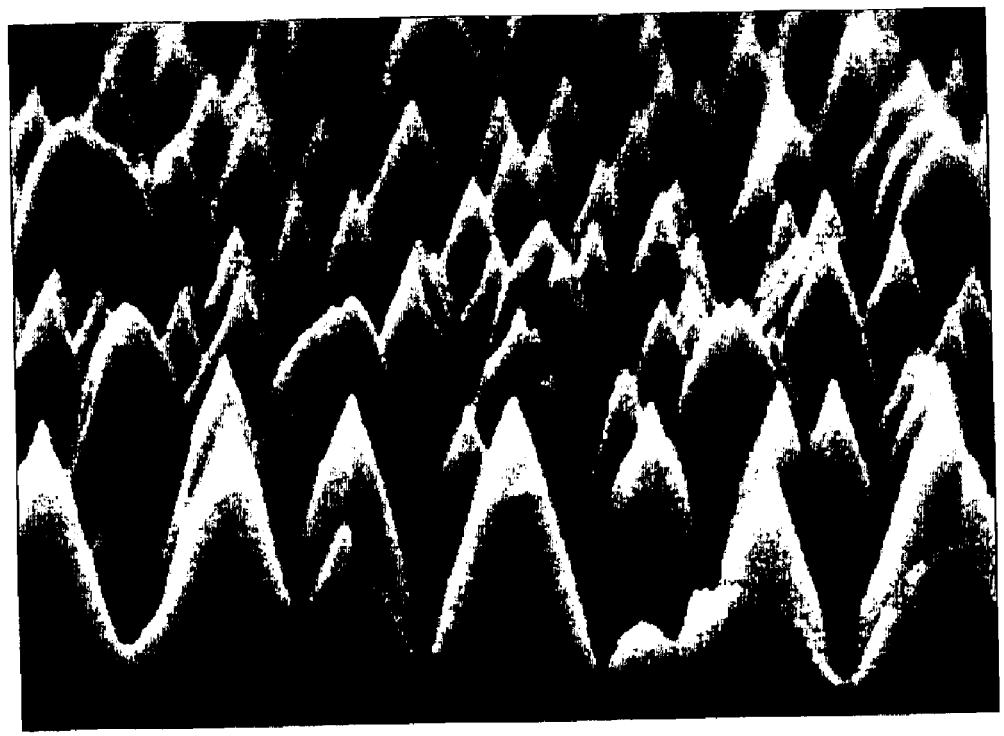
FIG. 10 is a microphotograph illustrating the features of the recessed/projected surface according to one embodiment of the present invention.

It was possible in this manner to uniformly form finely recessed/projected portions on the surface of the InGaAlP current diffusion layer 76, each projected portion having a cone-like configuration about 100±50 nm in base length and about 200±100 nm in height. FIG. 10 shows an electron microphotograph of the finely recessed/projected portions.
(Tenth Embodiment)

A method of working an underlying substrate by using a multi-layer resist system will be explained with reference to FIGS. 11A to 11C.

Figure 11A:
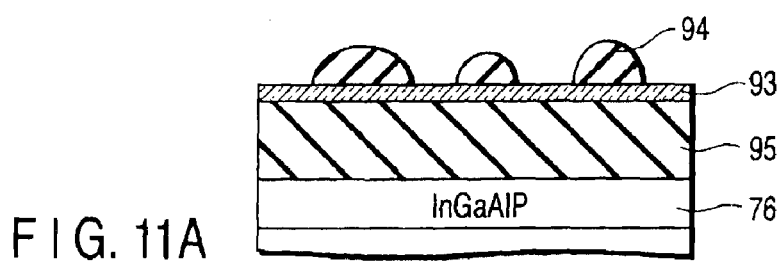
FIGS. 11A to 11C are cross-sectional views each illustrating, stepwise, the manufacturing steps of an LED according to a further embodiment of the present invention.

First of all, as shown in FIG. 11A, an underlying resist film (positive novolac resist) 95 having a thickness of 0.1 μm was formed on the surface of the InGaAlP current diffusion layer 76. The resist to be employed in this case may not contain a photosensitive agent. Then, an SOG film 93 and a polymer film were formed on the surface of the underlying resist film 95 in the same manner as described above. After the diblock copolymer contained in the polymer layer was allowed to underego phase separation thereof, this phase-separated polymer film was subjected to etching for 30 seconds by RIE using $O_2$ gas (30 sccm) under the conditions of 13 Pa in pressure and 100 W in power output, thereby forming a polymer pattern 94.

Figure 11B:
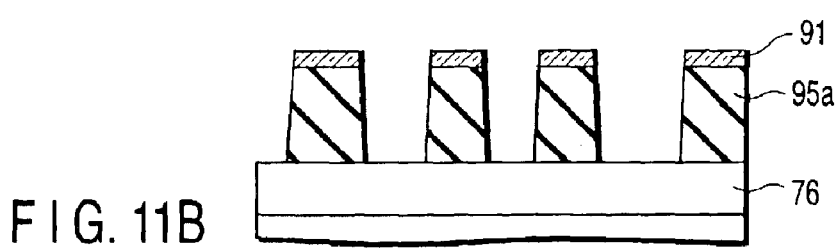

This polymer pattern 94 was then employed as a mask to etch the SOG film 93 by RIE, and the underlying resist film 95 was etched by RIE using $O_2$ gas (8 sccm) and $N_2$ gas (80 sccm) under the conditions of 2 Pa in pressure and 300 W in power output, thereby forming a resist pattern 95a as shown in FIG. 11B.

Figure 11C:

Then, after the InGaAlP current diffusion layer 76 was etched by RIE under the same conditions as described in the ninth embodiment, a resist pattern 95a was peeled off by using an $O_2$ asher, thereby forming, as shown in FIG. 11C, finely recessed/projected portions 83 on the surface of the InGaAlP current diffusion layer 76, each projected portion thereof having a cone-like configuration about 50–200 nm in width and 100–500 nm in height.

It was possible in this manner to uniformly form finely recessed/projected portions on the surface of the InGaAlP current diffusion layer 76, each projected portion having a cone-like configuration 100±50 nm in base length and 300±150 nm in height.

According to this embodiment, since the finely recessed/projected portions that have been defined as mentioned above are formed on the light-extracting surface, it is now possible to prevent the degrading of the light extraction efficiency that may be caused due to the influence by the total reflection of light. As a result, it is now possible to enhance the light extraction efficiency. Furthermore, it is now possible to minimize the internal absorption loss that may be caused by the multi-reflection in the interior of the semiconductor layer, thereby making it possible to realize a light-emitting element capable of extremely minimizing temperature increase. Additionally, since the surface-roughening treatment using a diblock copolymer is applied to the light-extracting surface, it is now possible to uniformly form finely recessed/projected portions without depending on the crystal orientation of the underlying layer.

The present invention should not be construed as being limited to the aforementioned embodiments. For example, as for the materials for forming the polymer layer, it is possible to employ any diblock copolymer as long as they are capable of selectively removing one of the components that have been phase-separated. The finely recessed/projected portions can be formed on any desired layer as long as it is located at an uppermost layer of the light-extracting side and at the same time, capable of being worked through etching using a phase-separated polymer film as a mask.

Further, as far as the projected portion of the finely recessed/projected portions is formed of a cone-like configuration, it is possible to obtain the advantages as mentioned above. Furthermore, the finely recessed/projected portions having a cone-like configuration may be formed on each of the surfaces (top and side surfaces) of the chip other than the portions where electrodes are formed. The aforementioned advantages would not be hindered even if the electrodes are formed after the finely recessed/projected portions have been formed all over the light-extracting surface. The present invention can be executed by modifying it in various ways as long as such variations do not exceed the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor light-emitting element, comprising:

forming a semiconductor laminate on a first surface of a substrate having a first surface and a second surface; said semiconductor laminate containing a light-emitting layer;

determining a light-extracting surface for extracting light from said light-emitting layer;

forming a polymer film comprising a diblock copolymer on said light-extracting surface;

subjecting said polymer film to an annealing treatment, thereby phase-separating said diblock copolymer into two phases;

eliminating one of the phases of the diblock copolymer that has been phase-separated to form a mask material layer having a pattern constituted by the other phase; and transferring said pattern of the mask material layer to said light-extracting surface to form finely recessed/projected portions on said light-extracting surface.

2. The method according to claim 1, wherein said polymer film is formed on the outermost surface of said semiconductor laminate.

3. The method according to claim 1, wherein said polymer film is formed on said second surface of said substrate.

4. The method according to claim 3, wherein said substrate is formed of a transparent substrate.

5. The method according to claim 1, further comprising:
forming a transparent film on said semiconductor laminate prior to the formation of said polymer film on said light-extracting surface, said transparent film being made of an oxide or a nitride;
wherein said light-extracting surface is constituted by the surface of said transparent film.

6. The method according to claim 1, wherein said diblock copolymer contains an aromatic ring-containing polymer chain and an acrylic polymer chain.

7. The method according to claim 6, wherein said aromatic ring-containing polymer chain includes polystyrene, and said acrylic polymer chain includes poly(methyl methacrylate), wherein said diblock copolymer is phase-separated into polystyrene and poly(methyl methacrylate) by said annealing treatment, and said mask material layer is formed by eliminating said poly(methyl methacrylate), thereby leaving behind a pattern of said polystyrene.

8. The method according to claim 7, wherein said elimination of said poly(methyl methacrylate) is performed by etching said polymer layer containing said diblock copolymer which has undergone said phase separation.

9. The method according to claim 7, wherein said elimination of said poly(methyl methacrylate) is performed by applying irradiation of an electron beam, a development treatment and a rinsing treatment to said polymer layer containing said diblock copolymer which has undergone said phase separation.

10. The method according to claim 1, wherein said diblock copolymer includes an aromatic ring-containing polymer chain and an aliphatic double-bond polymer chain.

11. The method according to claim 9, wherein said aromatic ring-containing polymer chain includes polystyrene, and said aliphatic double-bond polymer chain includes polyisoprene, wherein said diblock copolymer is phase-separated into polystyrene and polyisoprene by said annealing treatment, and said mask material layer is formed by eliminating said polyisoprene to leave behind a pattern of said polystyrene by an ozone treatment.

12. The method according to claim 1, wherein said transferring of said pattern of the mask material layer to said light-extracting surface is performed by dry etching employing an RIE or by wet etching.

* * * * *